United States Patent
Kozawa et al.

(10) Patent No.: US 8,786,436 B2
(45) Date of Patent: Jul. 22, 2014

(54) MULTIPLE OPTICAL AXIS PHOTOELECTRIC SENSOR

(75) Inventors: Ryo Kozawa, Ritto (JP); Kazunori Osako, Otsu (JP)

(73) Assignee: OMRON Corporation, Kyoto-shi (JP)

( * ) Notice: Subject to any disclaimer, the term of this patent is extended or adjusted under 35 U.S.C. 154(b) by 336 days.

(21) Appl. No.: 13/203,812

(22) PCT Filed: Aug. 25, 2010

(86) PCT No.: PCT/JP2010/064352
§ 371 (c)(1),
(2), (4) Date: Sep. 28, 2011

(87) PCT Pub. No.: WO2011/024843
PCT Pub. Date: Mar. 3, 2011

(65) Prior Publication Data
US 2012/0032812 A1    Feb. 9, 2012

(30) Foreign Application Priority Data

Aug. 31, 2009    (JP) .................................. 2009-199682

(51) Int. Cl.
*G08B 21/00*    (2006.01)
(52) U.S. Cl.
USPC ........... 340/556; 340/550; 340/555; 340/557; 250/221; 250/222.1
(58) Field of Classification Search
USPC ........ 340/550, 555, 556, 557; 250/221, 222.1
See application file for complete search history.

(56) References Cited

U.S. PATENT DOCUMENTS

| | | | |
|---|---|---|---|
| 2003/0141975 A1* | 7/2003 | Hama et al. | 340/556 |
| 2005/0205763 A1* | 9/2005 | Beck et al. | 250/221 |
| 2005/0265723 A1* | 12/2005 | Lohmann | 398/140 |
| 2006/0071154 A1* | 4/2006 | Osako et al. | 250/221 |
| 2007/0125938 A1* | 6/2007 | Kikuchi et al. | 250/221 |

FOREIGN PATENT DOCUMENTS

| | | |
|---|---|---|
| CN | 101382600 A | 3/2009 |
| JP | H02-108441 U | 11/1990 |
| JP | H05-30787 U | 4/1993 |
| JP | 2002-323574 A | 11/2002 |

OTHER PUBLICATIONS

The summary of the office action issued to the corresponding Chinese patent application, Jun. 2013.

* cited by examiner

*Primary Examiner* — Nabil Syed
*Assistant Examiner* — Mark Rushing
(74) *Attorney, Agent, or Firm* — Marvin A. Motsenbocker; Mots Law, PLLC

(57) ABSTRACT

A multiple optical axis photoelectric sensor is provided that stops a control output according to light being obstructed in a detection area. First and second variable signals indicate the duration of an optical axis scan processing for which light entrance detection and light obstruction detection are obtained, respectively. The first and second variable signals are updated according to results of each scan in the optical axis scan processing. When the value of the first variable reaches a predetermined first reference value, and when a final value of the second variable is equal to or lower than a predetermined second reference value, a notification is made that the light obstruction is detected due to a malfunction. As a result of this notification, whether output signal of the sensor is erroneously switched due to a cause other than an object of a detection target can correctly be made.

28 Claims, 7 Drawing Sheets

O: light entrance is detected
x: light obstruction is detected

MULTIPLE OPTICAL AXIS PHOTOELECTRIC SENSOR

TECHNICAL FIELD

The present invention relates to a multiple optical axis photoelectric sensor that determines a light entrance/obstruction state of a two-dimensional detection area, formed by a plurality of optical axes, based on light entrance states of the optical axes provided between a projector and an optical receiver, and switches an on-state and an off-state of an output according to a determination result.

BACKGROUND ART

In a multiple optical axis photoelectric sensor that detects an object in a two-dimensional detection area, a projector in which a plurality of light emitting elements are provided and an optical receiver in which as many light receiving elements as the light emitting elements are provided are aligned such that each projector light emitting element faces each a corresponding receiver light receiving element on a one-to-one basis. In the multiple optical axis photoelectric sensor, the process of detecting whether light emitted from the light emitting element of the validated optical axis enters the corresponding light receiving element (hereinafter referred to as "optical scan processing"), and process of determining whether the light obstruction of the optical axis is generated in the detection area based on the optical axis scan processing, are repeatedly performed. Further, a function of outputting a control signal for operating an external device is provided in the multiple optical axis photoelectric sensor that is used for the purpose of safety. The control signal is set to an on-state while a determination that the light is not obstructed in the detection area is made (hereinafter referred to as a "light entrance determination"). On the other hand, when light obstruction is determined in the detection area (hereinafter referred to as a "light obstruction determination"), the control signal is set to an off-state, namely, a control output is stopped (see Patent Document 1).

Patent Document 1 describes that, for quickening response speed while minimizing erroneous determinations caused by disturbance light, the light emitting element of the validated optical axis is emitted multiple times. Determination is made by capturing a light reception signal from the light receiving element in synchronization with timing corresponding to the light emission for each time interval. A signal indicating detection of an object is outputted when the light obstruction state is detected a predetermined number of times.

PRIOR ART DOCUMENT

Patent Document

Patent Document 1: Japanese Patent No. 3548754

SUMMARY OF THE INVENTION

Problems to be Solved by the Invention

As described in Patent Document 1, in a multiple optical axis photoelectric sensor, for safety, response speed to light obstruction of the optical axis is enhanced to reliably stop a machine when a human body enters a dangerous region. However, when the response speed is enhanced, light obstruction may be detected to stop the machine, even when the light obstruction of the optical axis is generated for a short period, due to passing of an insect through the detection area of the sensor or to a deviation in optical axis between the projector and the optical receiver.

To maintain safety, sensor performance should not degrade. However, productivity is impaired when the machine is frequently stopped for non-dangerous conditions. This prompts the need to understand the light obstruction of the optical axis for causes other than from detection of intended objects (usually, a human body), and to establish conditions to maintain performance. However, in the conventional multiple optical axis photoelectric sensor, there is no means for recognizing what cause generates the light obstruction of the optical axis, and it is difficult to specify the cause of the light obstruction of the optical axis.

When a multiple optical axis photoelectric sensor is used for detecting an object for non-safety purposes, usually the output is set off. The output may be switched on when the light is obstructed in the detection area. In this case, it is also necessary to prevent light obstruction of the optical axis due to causes other than the object to be detected from affecting operation of a device that uses the sensor output.

In view of the above problems, an object of the present invention is to distinguish the case where the output is correctly switched by the object of the detection target and the case where the output is erroneously switched due to a cause other than the object to be detected and to be able to correctly analyze the operation of the multiple optical axis photoelectric sensor by notifying the latter case as a malfunction.

Means for Solving the Problems

In a multiple optical axis photoelectric sensor according to the present invention, a plurality of optical axes are provided between a projector and an optical receiver. The optical axes are sequentially validated, optical scan processing is repeatedly performed to detect the existence or non-existence of light at the entrance of the validated optical axis and processing is repeatedly performed to determine a light entrance/obstruction state of a detection area formed by the optical axes based on a result of the optical axis scan processing. An on-state and an off-state of an output are switched according to a determination result. The multiple optical axis photoelectric sensor includes malfunction notification means, variable update means, and notification control means, which are described below.

In a first multiple optical axis photoelectric sensor of the present invention, the malfunction notification means notifies that an output indicating the determination result that the detection area is in the light obstruction state due to a malfunction is performed. A variable update means updates a first variable and a second variable according to every determination result of the optical axis scan processing, with the first variable indicating a duration of the optical axis scan processing for which the determination result that the detection area is in a light entrance state is obtained, and the second variable indicating a duration of the optical axis scan processing for which the determination result that the detection area is in the light obstruction state is obtained. The notification control means activates the malfunction notification means on a condition that a value of the first variable, which is updated while the determination that the detection area is in the light entrance state is continuously made, reaches a predetermined first reference value, and on a condition that a final value of the second variable, which is updated according to the previous determination that the detection area is in the light obstruction state, is equal to or lower than a predetermined second reference value.

The first multiple optical axis photoelectric sensor is a type that detects that the object enters the detection area where the object does not usually exist. According to the above configuration, even if the signal indicating that the object is detected is outputted according to the transition of the determination result of the optical axis scan processing from the light entrance determination to the light obstruction determination, when the duration of the light obstruction determination is shorter than the time indicated by the second reference value, a notification is made that the output is performed due to a malfunction based on the fact that the light entrance determination continues until the time corresponding to the first reference value and elapses after that. Therefore, when the second reference value is set according to the duration for which the light obstruction state is obtained in the detection area by the detection target, in the case where the output is switched according to the light obstruction state in a period shorter than the case where the light is obstructed by the detection target, a notification can be made as a malfunction. Therefore, the user easily distinguishes the light obstruction determination of the detection target and the light obstruction determination of another cause, and the user can analyze the surrounding environment when the light obstruction determination of another cause is generated.

In a second multiple optical axis photoelectric sensor of the present invention, the malfunction notification means provides an output indicating the determination result that the detection area is in the light entrance state due to a malfunction. The variable update means updates a first variable and a second variable according to every determination result of the optical axis scan processing with he first variable indicating a duration of the optical axis scan processing for which the determination result that the detection area is in the light obstruction state is obtained, and the second variable indicating a duration of the optical axis scan processing for which the determination result that the detection area is in the light entrance state is obtained. The notification control means activates the malfunction notification means on a condition that a value of the first variable, which is updated while the determination that the detection area is in the light obstruction state is continuously made, reaches a predetermined first reference value, and on a condition that a final value of the second variable, which is updated according to the previous determination that the detection area is in the light entrance state, is equal to or lower than a predetermined second reference value.

The second multiple optical axis photoelectric sensor is a type in which the light is usually obstructed in the detection area by the object of the detection target. Exit of the object from the detection area is detected by a change in the determination result from the light obstruction determination to the light entrance determination. According to the above configuration, even if the signal indicating that the object has exited from the detection area is outputted according to the transition of the determination result of the optical axis scan processing from the light obstruction determination to the light entrance determination, when the duration of the light entrance determination is shorter than the time indicated by the second variable, a notification is made that the output is performed due to the malfunction based on the fact that the light obstruction determination continues until the time corresponding to the first reference value elapses after the light entrance. Therefore, when the second variable is previously set based on the time the light entrance state is generated by the usual motion of the detection target, in the case where the output is switched according to the light entrance state in a period shorter than the case where the light entrance is generated by the motion of the detection target, a notification can be made that it is due to the malfunction. Therefore, the user easily distinguishes the light entrance determination of the detection target and the light entrance determination of another cause, and the user can analyze the surrounding environment when the light obstruction determination of another cause is generated.

In the case where the first and second multiple optical axis photoelectric sensors act as a safety sensor, an output means is provided for outputting a control signal in order to operate an external device, and an output stopping means is provided for stopping the output of the control signal from the output means when the value of the second variable reaches the second reference value or a given threshold smaller than the second reference value. According to the above configuration, the output of the control signal is stopped to stop the external device according to the entry of the detection target into the detection area or the exit of the detection target from the detection area. In the case where the output of the control signal is stopped due to a cause other than the detection target, a notification can be made that the output is stopped due to the malfunction.

In the case where the output of the control signal is controlled as described above, the control output may immediately be stopped according to the switching of the determination result of the optical axis scan processing, but the present invention is not limited thereto. For example, in the first multiple optical axis photoelectric sensor, the output of the control signal may be switched based on the fact that the light obstruction is continuously detected a plurality of times in the same optical axis. In the second multiple optical axis photoelectric sensor, the output of the control signal may be switched based on the fact that the light entrance is continuously detected a plurality of times in the same optical axis.

Further, in the case where the first and second multiple optical axis photoelectric sensors act as a safety sensor, it is desirable that storage means for storing information from the optical axis scan processing in which the output of the control signal is stopped according to the activation of the malfunction notification means, and this is further provided.

For example, at a time when the determination result of the optical axis scan processing is switched, the final value of the second counter or a duration corresponding to the final value, identification information on the optical axis in which the light entrance/obstruction state is changed can be stored. Therefore, the cause of the light obstruction of the optical axis can easily be understood by performing the detailed analysis of the stored information.

In another preferred mode of the first and second multiple optical axis photoelectric sensors, the second reference value is set to a value smaller than that of the first reference value. Therefore, in the case where the output is switched by the change from the usual detection state (the light entrance detection in the first multiple optical axis photoelectric sensor, and the light obstruction detection in the second multiple optical axis photoelectric sensor) to the detection state different from the usual state (the light obstruction detection in the first multiple optical axis photoelectric sensor, and the light entrance detection in the second multiple optical axis photoelectric sensor), the detection state returns to the usual detection state after the switching, and a notification is made of the malfunction based on the fact that the time elapse is sufficiently longer than the time the detection state is different from the usual state. Therefore, in the case where a state in which the usual state and the state different from the usual state are switched in a short period continues, the state is not notified as the malfunction, but the malfunction notification can stably be performed.

In a preferred mode, the variable update means of the first and second multiple optical axis photoelectric sensors performs processing of measuring the number of times of the optical axis scan processing, in which the determination result that the detection area is in the light entrance state is obtained, and the number of times of the optical axis scan processing, in which the determination result that the detection area is in the light obstruction state is obtained, as the processing of updating the first variable and the second variable. In another preferred mode, the variable update means performs processing of measuring the number of times of the optical axis scan processing, in which the determination result that the detection area is in the light entrance state is obtained, and the number of times of the optical axis scan processing, in which the determination result that the detection area is in the light obstruction state is obtained, and processing of converting measurement values into times.

In still another preferred mode, the variable update means performs processing of measuring a duration of the optical axis scan processing, for which the determination result that the detection area is in the light entrance state is obtained, and a duration of the optical axis scan processing, for which the determination result that the detection area is in the light obstruction state is obtained as the processing of updating the first variable and the second variable.

In another preferred mode of the first and second multiple optical axis photoelectric sensors, display control information for displaying the detection of the malfunction on a display is externally outputted when the notification control means activates the malfunction notification means. Therefore, the operating situation of the multiple optical axis photoelectric sensor can be acknowledged on a screen of the display to enhance user-friendliness. Although the display control information may directly be output to the display, the display control information is output to a control device in the case where the operation of the display is controlled by the control device such as a personal computer.

Effects of the Invention

According to the present invention, the case where the output is switched by the motion of the detection target and the case where the output is switched by another cause can be distinguished from each other based on whether the malfunction notification means performs the notification. Therefore, the cause of the malfunction is specified by analyzing a situation of the surrounding environment in performing the notification, and a measure to solve this cause can be taken.

EMBODIMENTS FOR CARRYING OUT THE INVENTION

Figure 1:
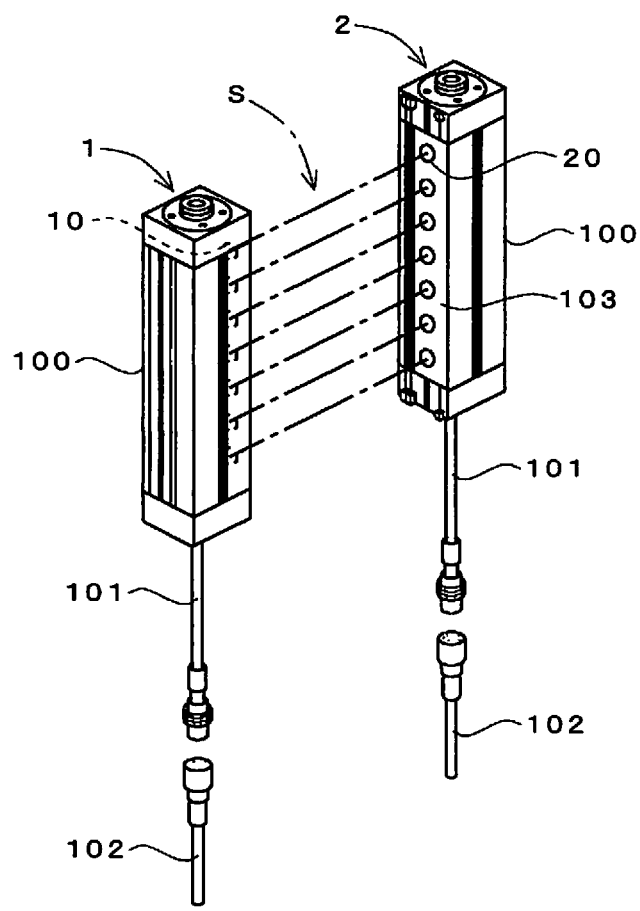
FIG. 1 is a perspective view illustrating an appearance of a multiple optical axis photoelectric sensor.

FIG. 1 is a perspective view illustrating an appearance of a multiple optical axis photoelectric sensor of the present invention.

Each of a projector 1 and an optical receiver 2 of the multiple optical axis photoelectric sensor is configured such that a plurality of optical elements (a light emitting element 10 in the projector 1 and a light receiving element 20 in the optical receiver 2) and a control board (not illustrated) are accommodated in a rectangular-solid casing 100. A cord 101 in which various signal lines are collected is drawn from a lower end of each casing 100. A second cord 102 for extension is connected to the cord 101.

A window portion 103 for transmitting light is formed in a front surface of each casing 100. The light emitting elements 10 and the light receiving elements 20 are disposed so as to be arrayed along a longitudinal direction of the casing 100, such that the light transmission surfaces of the light emitting elements 10 and the light receiving surfaces of the light receiving elements 20 are disposed opposite to the window portions 103. The projector 1 and the optical receiver 2 are disposed opposite to each other with a predetermined interval such that each light emitting element 10 and each light receiving element 20 are disposed opposite to each other on a one-to-one basis. Therefore, positions and orientations of optical axes of the light emitting element 10 and the light receiving element 20 are aligned with each other in each combination of the light emitting element 10 and the light receiving element 20, and a two-dimensional detection area S is formed by the plurality of optical axes.

Figure 2:
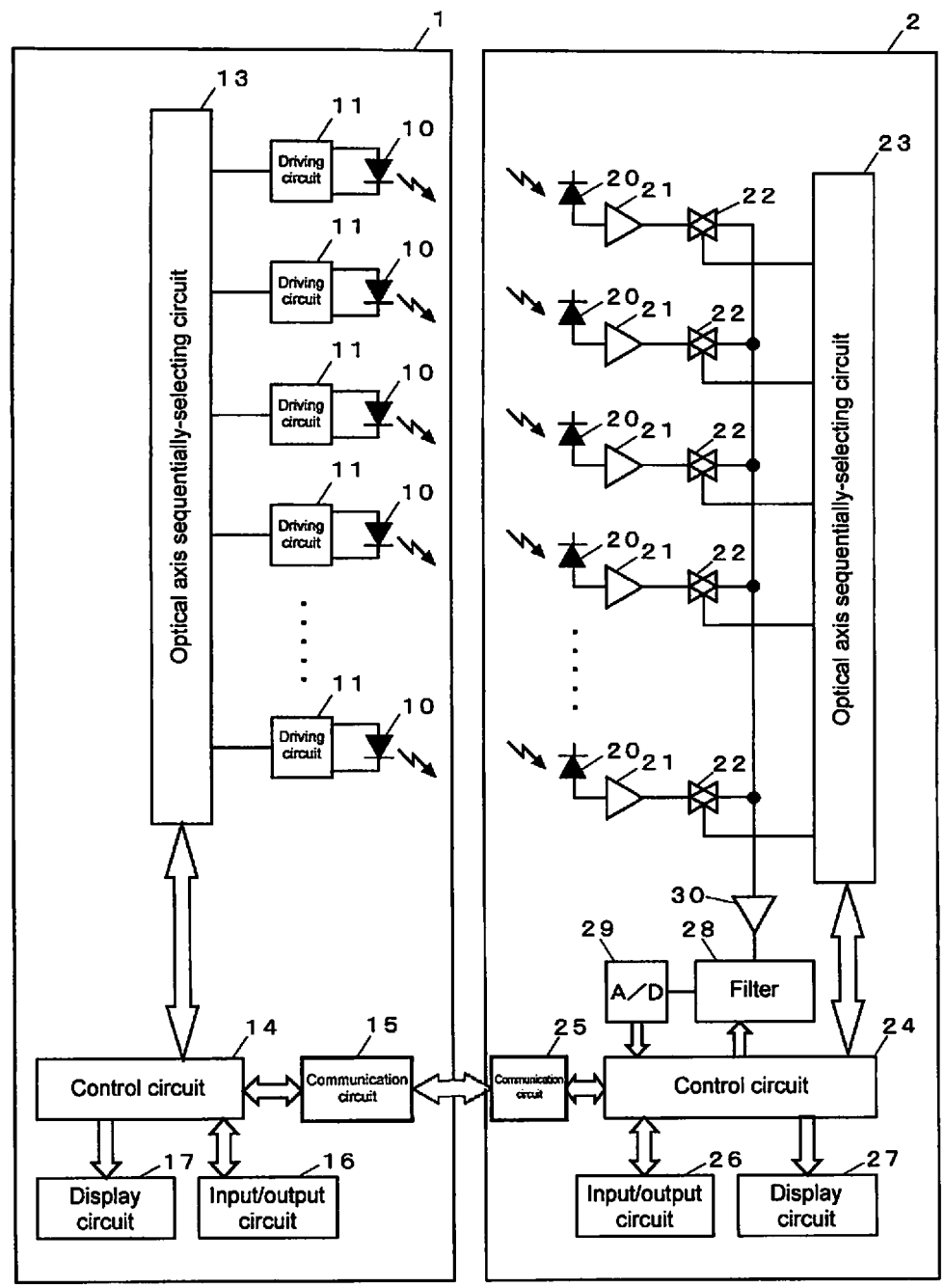
FIG. 2 is a block diagram of the multiple optical axis photoelectric sensor.

FIG. 2 illustrates an electric configuration of the multiple optical axis photoelectric sensor described above.

In the projector 1, an LED is used as the light emitting element 10. In the optical receiver 2, a photodiode is used as the light receiving element 20. In the projector 1, a driving circuit 11 is provided in each light emitting element 10. An optical axis sequentially-selecting circuit 13, a control circuit 14, a communication circuit 15, an input/output circuit 16, and a display circuit 17 are also provided in the projector 1.

Each light emitting element 10 is connected to the control circuit 14 through the driving circuit 11 and the optical axis sequentially-selecting circuit 13.

In the optical receiver 2, an amplifier circuit 21 and an analog switch 22 are provided in each light receiving element 20. An optical axis sequentially-selecting circuit 23, a control circuit 24, a communication circuit 25, an input/output circuit 26, a display circuit 27, a filter 28, an A/D conversion circuit 29, and an amplifier circuit 30 are also provided in the optical receiver 2. Each of the control circuits 14 and 24 includes a CPU and a memory.

Each of the optical axis sequentially-selecting circuits 13 and 23 of the projector 1 and the optical receiver 2 sequentially validates the optical axes. The control circuits 14 and 24 of the projector 1 and the optical receiver 2 conduct communication with each other through the communication circuits 15 and 25 to synchronize the timing of switching operations of the optical axis sequentially-selecting circuits 13 and 23.

The control circuit 14 of the projector 1 outputs a lighting control signal in synchronization with this switching timing, thereby sequentially lighting the light emitting elements 10 from the top optical axis.

The control circuit 24 of the optical receiver 2 sequentially turns the analog switches 22 into an on-state by the switching of the optical axis sequentially-selecting circuit 23. Therefore, a light reception signal from the light receiving element 20 corresponding to the light emitting element 10 is guided to the ND conversion circuit 29 through the amplifier circuit 30 and the filter 28 and converted into a digital signal, and the digital signal is input to the control circuit 24. The control circuit 24 compares the input light receiving amount to a predetermined light entrance threshold to detect whether each optical axis is in a light entrance state or a light obstruction state.

As described above, the optical axes are sequentially validated by cooperation between the projector 1 and the optical receiver 2 to drive the light emitting element 10 and the light receiving element 20 of the validated optical axis. The existence or non-existence of the light entrance is detected using the light receiving amount of the light receiving element 20. The sequential performance of the above processing from the top optical axis to the bottom optical axis corresponds to one-time optical axis scan processing.

Further, in this embodiment, following the optical axis scan processing, whether light is obstructed in the detection area S by an object is determined based on the detection result in each optical axis. Specifically, in this embodiment, the determination that the light is obstructed in the detection area S is made when the light obstruction is continuously detected twice on the same optical axis. Alternatively, the present invention is not limited thereto, and the determination that the light is obstructed in the detection area S may be made when the light obstruction is detected at least twice, regardless of whether the same optical axis is obstructed. Alternatively, the determination that the light is obstructed in the detection area S may be made immediately when a state in which the light entrance is detected in all the optical axes is switched to a state in which the light obstruction is detected in the optical axis.

Each of the input/output circuits 16 and 26 of the projector 1 and the optical receiver 2 includes an input port that inputs a signal for setting an operating mode of each sensor or a reset signal. The input/output circuit 26 of the optical receiver 2 includes two output ports that output the control signal, and the input/output circuit 16 of the projector 1 also includes an auxiliary output port.

The control signal output from the optical receiver 2 is used to control an operation of a relay incorporated in a power supply path for a machine in a dangerous region (not illustrated). In this embodiment, the optical axis scan processing and the processing of determining the existence or non-existence of the light obstruction in the detection area S are repeatedly performed, and the control signal is set to the on-state (high level) in the case of the determination that the light is not obstructed in the detection area S. On the other hand, in the case of the determination that the light is obstructed in the detection area S, the control signal is set to an off-state (low level) to stop a control output. Therefore, the supply of the electric power to the machine is stopped, and the operation of the machine is also stopped.

The stopping of the control output is maintained until the state in which the light obstruction of the optical axis is not detected through the optical axis scan processing and is continued for a given time after the light obstruction of the optical axis is eliminated. Therefore, the operation of the machine is stopped in a predetermined period even after the state in which the object is not detected, which allows safety to be secured.

Although not illustrated in FIGS. 1 and 2, a plurality of indicating lamps are provided at proper positions in front surfaces of the projector 1 and the optical receiver 2 in order to indicate a function set to the sensor, an operating state, and the light receiving amount of each optical axis. The display circuits 17 and 27 control the operations of the indicating lamps. One of the indicating lamps notifies a malfunction, which is to be described later.

The multiple optical axis photoelectric sensor of this embodiment can rapidly respond to the light obstruction of the optical axis to stop the control output by speed enhancement of the processing performed to each optical axis. For example, a time necessary for the one-time optical axis scan processing ranges from 10 to 20 milliseconds. Even considering how fast a human body moves, the human body takes at least several hundreds milliseconds to obstruct the optical axis. Therefore, according to the rule that a determination that the light is obstructed in the detection area S is made when the light obstruction is continuously detected twice in the same optical axis, in the case where the human body enters the detection area S, the multiple optical axis photoelectric sensor can immediately correspond to the entry of the human body to stop the control output.

However, when the processing speed is enhanced in this manner, the determination that the light is obstructed in the detection area may be made to stop the control output, even if the light is obstructed for about several tens of milliseconds due to passing of an insect through the detection area or a deviation in optical axis between the projector 1 and the optical receiver 2 due to a vibration caused by the surrounding machine or the like. Therefore, in this embodiment, the case where the light is obstructed in the optical axis for a time much shorter than the light obstruction time generated by the passing of the detection target (specifically, a human body) through the optical axis is determined to be the malfunction, the malfunction is detected by performing pieces of processing of FIGS. 3 and 4 described below, and a notification is made of the malfunction using the indicating lamp.

Figure 3:
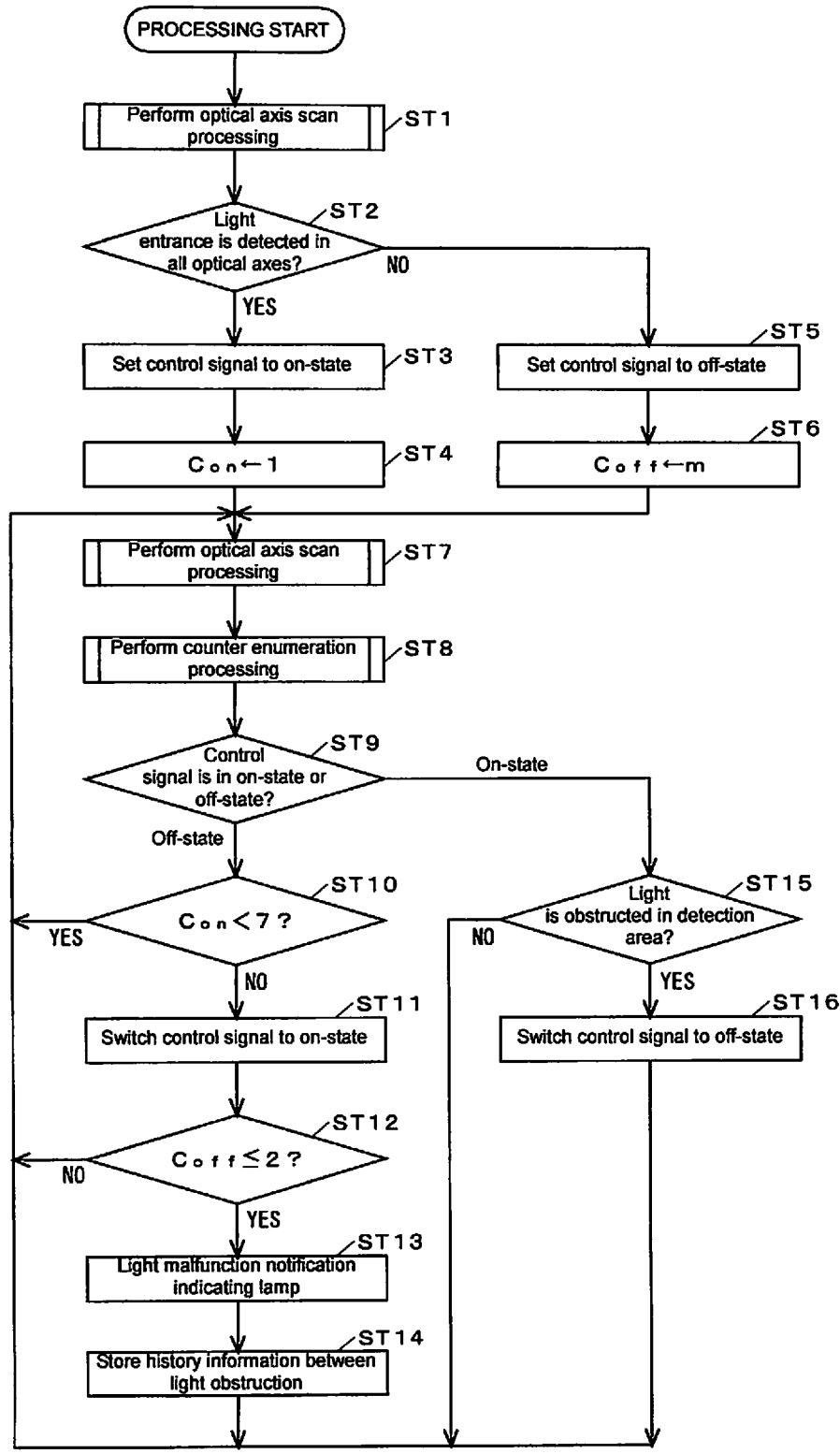
FIG. 3 is a flowchart illustrating a procedure of main processing in the multiple optical axis photoelectric sensor.
Figure 4:
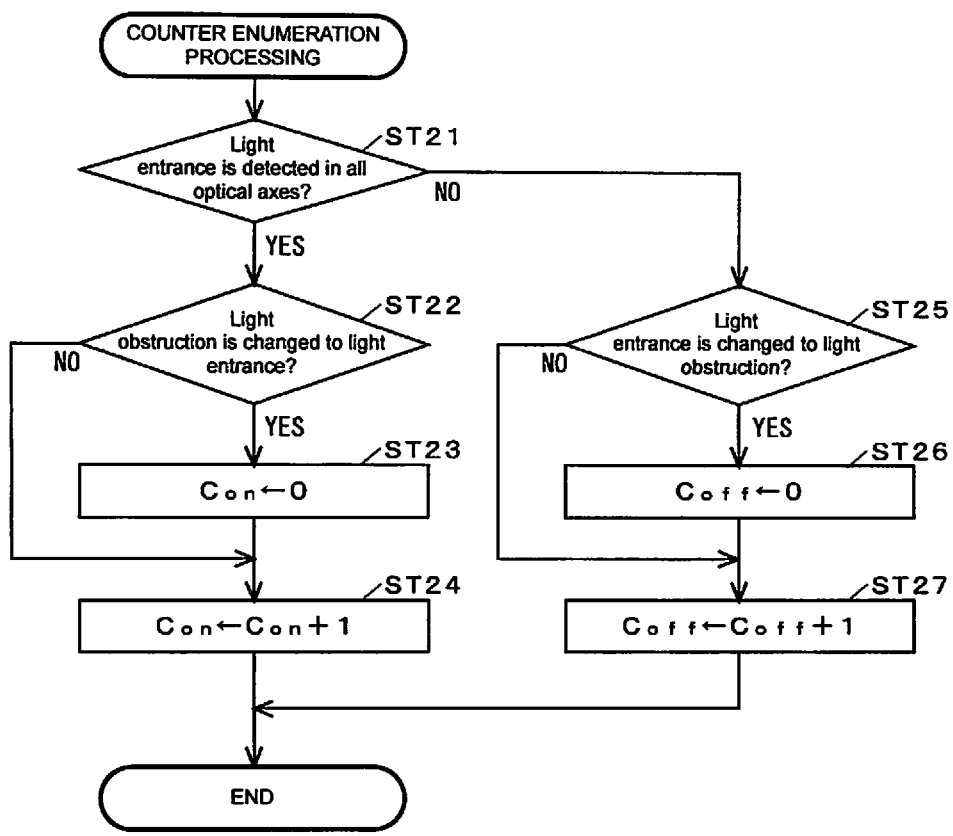
FIG. 4 is a flowchart illustrating a detailed procedure of counter enumeration processing.

Referring to FIGS. 3 and 4, a counter Con indicates the number of times of the optical axis scan processing in which the result that the light entrance is detected in all the optical axes is obtained, and a counter Coff indicates the number of times of the optical axis scan processing in which the result that the light obstruction of the optical axis is detected is obtained. The counter Con corresponds to a first variable described in "MEANS FOR SOLVING THE PROBLEMS", and the counter Coff corresponds to a second variable. Hereinafter, the counter Con is referred to as a "light entrance counter Con", and the counter Coff is referred to as a "light obstruction counter Coff". The counters Con and Coff are set to an initial value of 0 in initialization processing.

The pieces of processing of FIGS. 3 and 4 are performed by the cooperation between the control circuits 14 and 24 of the projector 1 and the optical receiver 2.

The first step (ST1) of FIG. 3 indicates the optical axis scan processing (hereinafter, referred to as "initial scan processing") immediately after the power is turned on. At this point, the optical axes are sequentially validated from the top optical axis to the bottom optical axis to detect the existence or non-existence of the light entrance of the validated optical axis.

In the initial scan processing, when the light entrance state is detected for all the optical axes ("YES" in ST2), the control signal is set to the on-state (ST3), and the light entrance counter Con is set to 1 (ST4). On the other hand, when the light obstruction of the optical axis is detected in the initial scan processing ("NO" in ST2), the control signal is set to the off-state (ST5), and the light obstruction counter Coff is set to a constant m (m is an integer of 2 or more) (ST6).

In this manner, when the control signal and the counter values are set according to the result of the initial scan processing, a loop including steps from ST7 is repeatedly performed.

In this loop, the optical axis scan processing (ST7) and the counter enumeration processing (ST8) are performed, and steps ST10 to ST14 or steps ST15 and ST16 are performed according to the on-state or the off-state of the control signal.

In ST7, similarly to ST1, the optical axes are sequentially validated from the top optical axis to the bottom optical axis to detect the existence or non-existence of the light entrance of the validated optical axis. In the counter enumeration processing of ST8, the light entrance counter Con or the light obstruction counter Coff is updated based on the detection result of the optical axis scan processing that is performed immediately before the counter enumeration processing and the optical axis scan processing that is performed in the last stage. FIG. 4 illustrates the details of the counter enumeration processing.

Specifically, referring to FIG. 4, when the light entrance is detected for all the optical axes in the last optical axis scan processing ("YES" in ST21) and when the light obstruction of the optical axis is detected in the previous optical axis scan processing ("YES" in ST22), the light entrance counter Con is reset to zero (ST23), and then the light entrance counter Con is incremented (ST24). Therefore, the light entrance counter Con becomes the value of 1.

When the light entrance is detected for all the optical axes in both the last optical axis scan processing and the previous optical axis scan processing ("YES" in ST21 and "NO" in ST22), the light entrance counter Con is not reset (ST23), but only the light entrance counter Con is incremented (ST24).

When the light obstruction of the optical axis is detected in the last optical axis scan processing ("NO" in ST21) and when the light entrance is detected for all the optical axes in the previous optical axis scan processing ("YES" in ST25), the light obstruction counter Coff is reset to zero (ST26), and then the light obstruction counter Coff is incremented (ST27). Therefore, the light obstruction counter Coff becomes the value of 1.

When the light obstruction of the optical axis is detected in both the last optical axis scan processing and the previous optical axis scan processing ("NO" in ST21 and ST25), the light obstruction counter Coff is not reset (ST26), but only the light obstruction counter Coff is incremented (ST27).

Returning to FIG. 3, when the counter enumeration processing is performed by the above procedure, processing having different contents is performed according to the state of the current control signal. In the case where the control signal is in the on-state, the flow goes from ST9 to ST15, and whether the light is obstructed in the detection area S is determined using the results of the last optical axis scan processing and the previous optical axis scan processing. In this embodiment, aside from the counter enumeration processing, the number of times the light obstruction is continuously detected is counted in each optical axis, and the determination that the light is obstructed in the detection area is made when the number of times the light obstruction is continuously detected reaches 2 in one of the optical axes. When this determination is made ("YES" in ST15), the control signal is switched to the off-state (ST16). Therefore, the control output is stopped.

On the other hand, when the determination that the light is not obstructed in the detection area is made ("NO" in ST15), the control signal is maintained in the on-state.

When the control signal is already set to the off-state, the flow goes from ST9 to ST10 to check the light entrance counter Con. In this embodiment, the control signal is switched from the off-state to the on-state when the light entrance counter Con reaches 7, namely, when the result that the light entrance is detected in all the optical axes is continuously obtained 7 times (ST10 and ST11). At this point, when the light obstruction counter Coff is 2 or less ("YES" in ST12), the malfunction notification indicating lamp is lit (ST13). The time the optical axis scan processing associated with the update of the light obstruction counter Coff is performed, a duration according to the value of the light obstruction counter Coff, and an identification number of the optical axis in which the light obstruction is detected, are stored in the memory as history information (ST14).

In the case where the control signal is in the off-state, when the light entrance counter Con is smaller than 7 ("YES" in ST10), the control signal is maintained in the off-state. Even if the light entrance counter Con reaches 7 to switch the control signal to the on-state (in the case where ST11 is performed by the determination "NO" in ST10), the malfunction notification (ST13) and the processing of storing the history information (ST14) are skipped when the light obstruction counter Coff is larger than 2 ("NO" in ST12).

The notification performed by lighting the indicating lamp is ended after being continued for a predetermined time. Instead of lighting the indicating lamp, in the case where the sensor is connected to an external device such as a personal computer, display control information indicating the generation of the malfunction may be transmitted to the external device and displayed on a display.

Figure 5:
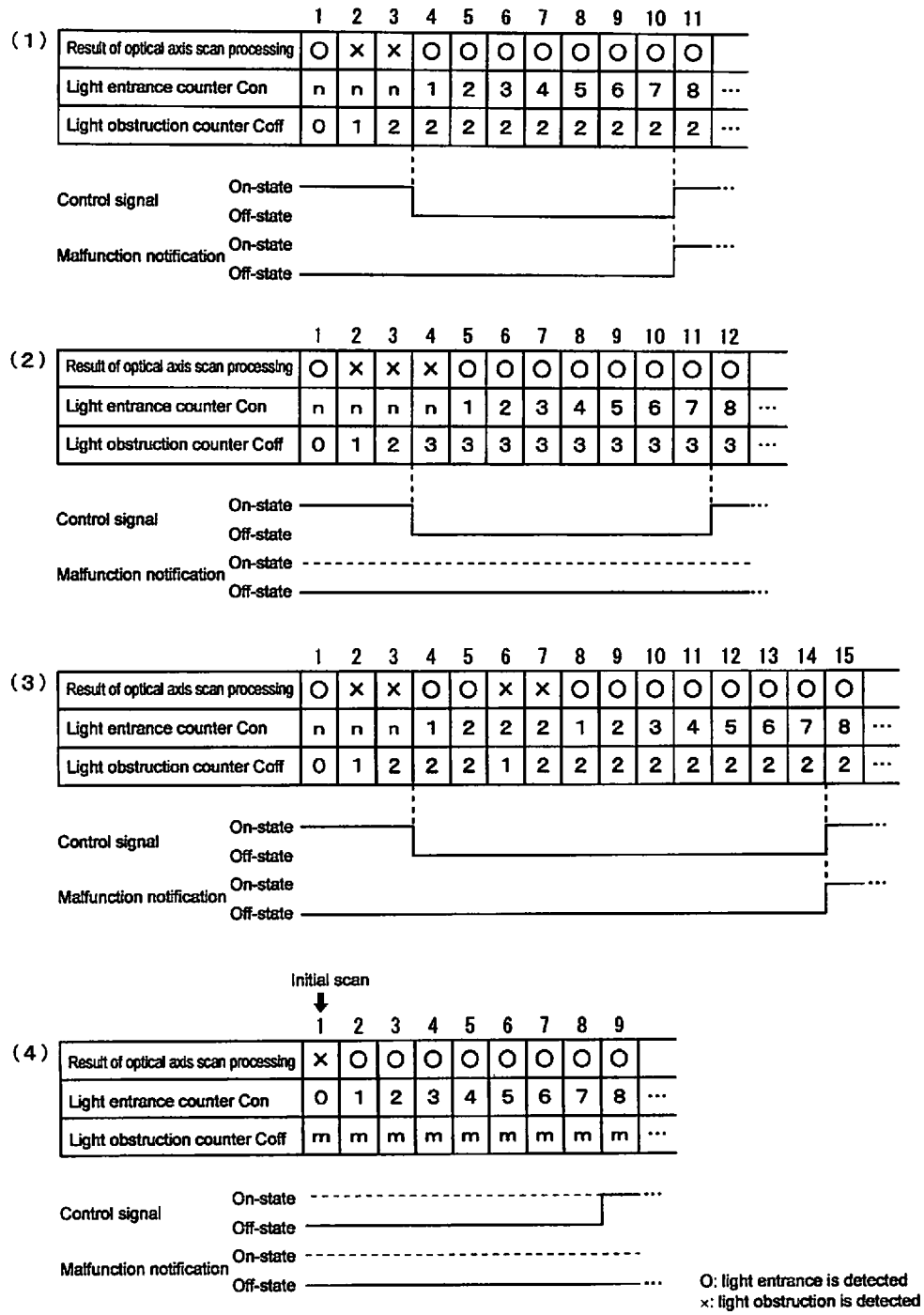
FIG. 5 is an explanatory view illustrating a specific example of optical axis scan processing while a control signal and a malfunction notification state are correlated with changes in values of a light entrance counter and a light obstruction counter based on the procedure of FIG. 4.

FIG. 5 illustrates four case examples of a transition of the result of the optical axis scan processing, while the on-state and the off-state of the control signal and a malfunction notification state are correlated with changes in values corresponding to the detection results of the light entrance counter Con and the light obstruction counter Coff for each case example. In each case example, the case where the light entrance is detected in all the optical axes through the optical axis scan processing is indicated by a mark "○", and the case where the light obstruction of the optical axis is detected through the optical axis scan processing is indicated by a mark "x". Hereinafter, the detection result of the mark "○" is referred to as "light entrance detection", and the detection result of the mark "x" is referred to as "light obstruction detection".

In the examples (1) to (3), it is assumed that the optical axis scan processing is performed a plurality of times until the first result (field of left end) illustrated in the figure is obtained after the power is turned on. In the example (4), it is assumed that the optical axis scan processing is illustrated immediately after the power is turned on. In each example, each piece of optical axis scan processing is indicated by a convenient serial number (1, 2, 3, . . . ).

In the example (1) of FIG. 5, the states are illustrated from the state in which the light entrance counter Con is n (n>0) while the light obstruction counter Coff is 0. In this example, the light entrance detection is switched to the light obstruction detection through the second optical axis scan processing. Because the process of incrementing is performed after the light obstruction counter Coff is reset to zero (ST26 and ST27 of FIG. 4), the light obstruction counter Coff is changed from 0 to 1. Since the light obstruction detection is also obtained through the next optical axis scan processing, the light obstruction counter Coff is incremented (ST27), and the light obstruction counter Coff is thereby changed to 2. According to FIG. 4, since the light entrance counter Con is not updated while the light obstruction detection continues, the light entrance counter Con is maintained at the value of n while the light obstruction counter Coff is updated.

In the fourth optical axis scan processing in the example (1) of FIG. 5, the light obstruction detection is returned to the light entrance detection. Therefore, the processing in ST23 and ST 24 of FIG. 4 are performed, and the light entrance counter Con is changed from n to 1. Because the light entrance detection continues through the subsequent pieces of optical axis scan processing, the light entrance counter Con is incremented every time (ST24), and the light entrance counter Con is increased by 1. According to FIG. 4, because the light obstruction counter Coff is not updated while the light entrance detection continues, the light obstruction counter Coff is maintained at the value of 2 while the light entrance counter Con is updated.

In the example (1) of FIG. 5, it is assumed that the optical axis in which the light obstruction is detected through the second optical axis scan processing is identical to the optical axis in which the light obstruction is detected through the third optical axis scan processing in the figure. Accordingly, since the determination that the light is obstructed in the detection area S is made in the determination processing after the third optical axis scan processing, the control signal is changed from the on-state to the off-state, and the control signal is maintained in the off-state until the light entrance counter Con reaches 7.

In the figure, when the light entrance counter Con reaches 7 through the tenth optical axis scan processing, the control signal returns to the on-state. At this point, because the light obstruction counter Coff is 2, the malfunction notification is performed at the same time as the control signal returns to the on-state.

In the example (2) of FIG. 5 as well, the states are illustrated from the state in which the light entrance counter Con is n while the light obstruction counter Coff is 0, and the light entrance detection is changed to the light obstruction detection in the second optical axis scan processing in the figure. In this case as well, when assuming that the optical axis in which the light obstruction is detected through the second optical axis scan processing is identical to the optical axis in which the light obstruction is detected through the third optical axis scan processing, the control signal is changed from the on-state to the off-state according to the result of the third optical axis scan processing.

In the example (2) of FIG. 5, the light obstruction detection is obtained through the fourth optical axis scan processing following the second and third pieces of optical axis scan processing. Therefore, the light obstruction counter Coff is updated to 3, and the light entrance counter Con is maintained at the value of n.

Because the light obstruction detection is changed to the light entrance detection through the fifth optical axis scan processing, the pieces of processing in ST23 and ST24 are performed, and the light entrance counter Con is updated to 1. Because the light entrance detection continues through the subsequent pieces of optical axis scan processing, the light entrance counter Con is incremented every time. During this time, the light obstruction counter Coff is maintained at 3.

When the light entrance counter Con reaches 7 through the eleventh optical axis scan processing, the control signal returns to the on-state. However, because the light obstruction counter Coff is 3 at this time, the malfunction notification is not performed.

In the example (3) of FIG. 5, the light obstruction counter Coff is changed from 0 to 1 because the light obstruction detection is obtained in the result of the second optical axis scan processing. Further, assuming that, in the third optical axis scan processing, the light obstruction is detected in the same optical axis as the second optical axis scan processing, the light obstruction counter Coff is changed to the value of 2, and the control signal is switched from the on-state to the off-state.

In the example (3) of FIG. 5, the light entrance detection is obtained again through the next fourth optical axis scan processing, and the light entrance detection is also obtained through the fifth optical axis scan processing. Therefore, the light entrance counter Con is changed from n to 1 and further updated to 2. After the light obstruction detection is obtained again through the subsequent sixth and seventh pieces of optical axis scan processing, the light obstruction detection is switched to the light entrance detection. When the light obstruction detection is switched to the light entrance detection through the eighth optical axis scan processing in the figure, the light entrance counter Con is reset again, and the counting is started from 1. The light obstruction counter Coff is updated to 2 through the sixth and seventh pieces of optical axis scan processing. Thereafter, the light obstruction counter Coff is not changed until the light entrance detection continues, and the light obstruction counter Coff is maintained at 2.

In the example (3) of FIG. 5, after the control signal is set to the off-state according to the result of the third optical axis scan processing, the control signal is maintained in the off-state until the light entrance counter Con reaches 7, and the control signal returns to the on-state when the light entrance counter Con reaches 7 through the fourteenth optical axis scan processing. Because the light obstruction counter Coff is 2 when the light entrance counter Con reaches 7, the malfunction notification is performed at the same time as the control signal returns to the on-state.

In the example (3) of FIG. 5, the light entrance detection and the light obstruction detection are switched in a short period through the first to eighth pieces of optical axis scan processing in the figure. However, because the value of the light entrance counter Con is smaller than 7 when the light obstruction detection is switched to the light entrance detection, the control signal does not return to the on-state, and the malfunction notification is not performed.

In the example (4) of FIG. 5, because the result of the initial scan processing becomes the light obstruction detection, the initial control signal is set to the off-state through the pieces of processing in ST5 and ST6 of FIG. 3, and the light obstruction counter Coff becomes m (m>2). Because the light obstruction detection is switched to the light entrance detection through the second optical axis scan processing, the light entrance counter Con is changed from 0 to 1. Thereafter, although the light entrance counter Con is incremented every time as the light entrance state continues, the light obstruction counter Coff is maintained at m.

In the example (4) of FIG. 5, the control signal is switched to the on-state at the time the light entrance counter Con reaches 7. However, the malfunction notification is not performed because the value of the light obstruction counter Coff is larger than 2 at that time. The reason the malfunction notification is not performed even if the actual number of light obstruction times is 2 or less is that, in the case where the light is obstructed in the detection area S immediately after the power is turned on, there may be a possibility that the light is obstructed in the detection area S in a significant period before the power is turned on, and it cannot be said that the light is obstructed in a very short period.

As described above, according to the pieces of processing of FIGS. 3 and 4, the control signal is switched from the on-state to the off-state when the light obstruction is continuously detected twice in the same optical axis, and the control signal is maintained in the off-state until the light entrance is continuously detected seven times, even if the result of the subsequent optical axis scan processing is switched from the light obstruction detection to the light entrance detection.

When the light entrance is continuously detected seven times, the control output returns to the on-state. However, as illustrated in the examples (2) and (4) of FIG. 5, the malfunction notification is not performed unless the number of times of the light obstruction detection is equal to or lower than 2 before the light obstruction detection is switched to the light entrance detection. As illustrated in the example (3) of FIG. 5, even if the number of times of the light obstruction detection is equal to or lower than 2 before the light obstruction detection is switched to the light entrance detection, the malfunction notification is not performed when the light entrance detection is switched to the light obstruction detection again before the light entrance is continuously detected seven times. Therefore, the malfunction notification is performed only when the light entrance state continues stably after the light obstruction of the optical axis is generated in a very short period.

In the above embodiment, the value of the light obstruction counter Coff that is updated according to the light obstruction detection is maintained after the light obstruction detection is switched to the light entrance detection, and whether the malfunction notification is performed is determined based on the value of the light obstruction counter Coff when the light entrance counter Con reaches 7. However, the algorithm is not limited thereto. For example, the light obstruction counter Coff is reset when the light obstruction detection is switched to the light entrance detection, and a malfunction flag may be set when the light obstruction counter Coff is equal to or lower than 2 before the reset. In this case, when the light entrance state continues after the light obstruction of the optical axis is eliminated, and the light entrance counter Con reaches 7, the malfunction notification is performed on the condition that the malfunction flag is set. In the case where the light entrance detection is switched to the light obstruction detection before the light entrance counter Con reaches 7, the malfunction flag is reset.

Alternatively, the counter enumeration processing can be performed by a procedure of FIG. 6 described below.

Figure 6:
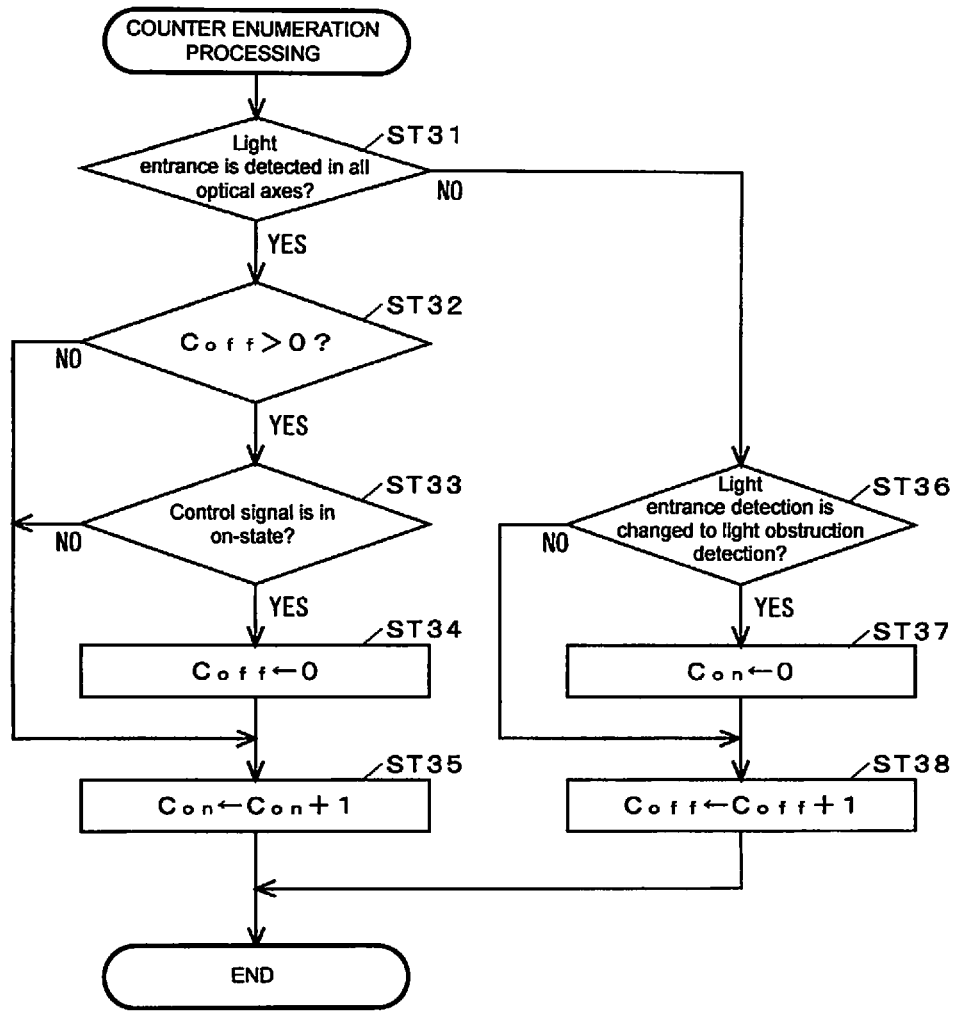
FIG. 6 is a flowchart illustrating another procedure of the counter enumeration processing.

The procedure of FIG. 6 is performed instead of the procedure of FIG. 4 with respect to the processing in ST7 of FIG. 3.

In this procedure as well, the light entrance counter Con is incremented (ST35) when the light entrance is detected for all the optical axes through the optical axis scan processing (that is, in the case of the light entrance detection), and the light obstruction counter Coff is incremented (ST38) when the light obstruction of the optical axis is detected (that is, in the case of the light obstruction detection).

In this embodiment, however, the timing at which the light entrance counter Con and the light obstruction counter Coff are reset differs from the procedure of FIG. 4. Specifically, when the value of the light obstruction counter Coff is larger than 0 in the case where the result of the optical axis scan processing becomes the light entrance detection ("YES" in ST31 and ST32), the light obstruction counter Coff is reset on the condition that the control signal is in the on-state at that time (ST33 and ST34). When the result of the optical axis scan processing is changed from the light entrance detection to the light obstruction detection ("NO" in ST31 and "YES" in ST36), the light entrance counter Con is reset (ST36 and ST37).

Figure 7:
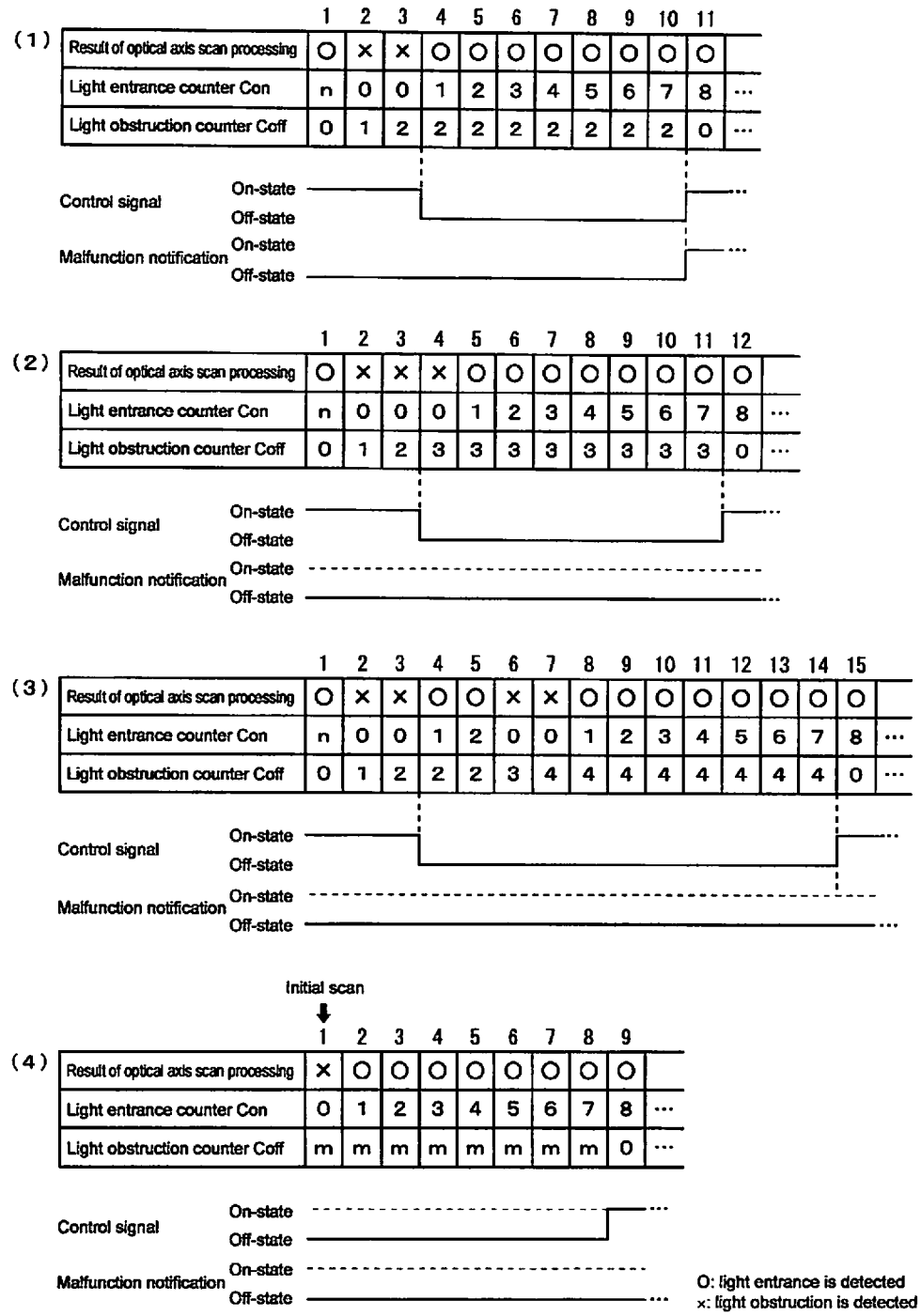
FIG. 7 is an explanatory view illustrating a specific example of the optical axis scan processing while the control signal and the malfunction notification state are correlated with the changes in values of the light entrance counter and the light obstruction counter based on the procedure of FIG. 6.

FIG. 7 illustrates, four case examples similar to those of FIG. 5 to which the counter enumeration processing of FIG. 6 is applied while the on-state and the off-state of the control signal and the malfunction notification state are correlated with the changes in values of the counters.

In (1) of FIG. 7, similarly to the example (1) of FIG. 5, assuming that the light obstruction is detected in the same optical axis through the second and third pieces of optical axis scan processing in the figure, the control signal is changed from the on-state to the off-state according to the result of the third optical axis scan processing.

In the example (1) of FIG. 7, because the result of the optical axis scan processing is switched from the light entrance detection to the light obstruction detection through the second optical axis scan processing, the pieces of processing in ST31 and ST36 to ST38 of FIG. 6 are performed, and the light entrance counter Con becomes 0 while the light obstruction counter Coff becomes 1. According to the result of the third optical axis scan processing, it is determined as "NO" in ST31 and ST36 to perform the processing in ST38. Therefore, the light obstruction counter Coff is changed to 2. On the other hand, the light entrance counter Con is maintained at 0.

When the light obstruction detection is switched to the light entrance detection again through the fourth optical axis scan processing, because the determinations "YES" are made in ST31 and ST32, the processing in ST35 is performed to increment the light entrance counter Con. Because the light entrance detection continues through the subsequent pieces of optical axis scan processing, the light entrance counter Con is incremented every time. However, because the control signal is in the off-state, the processing in ST34 is not performed, and the light obstruction counter Coff is maintained at 2. When the light entrance counter Con reaches 7 through the tenth optical axis scan processing, the malfunction notification is performed while the control signal returns to the on-state. Further, because the result of the eleventh optical axis scan processing after the notification is the light entrance detection, the pieces of processing in ST32 to ST34 are performed to reset the light obstruction counter Coff.

In the examples (2) and (3) of FIG. 7, similarly to the example (1) of FIG. 7, the control signal is changed from the on-state to the off-state according to the result of the third optical axis scan processing. The light entrance counter Con is reset when the light entrance detection is changed to the light obstruction detection through the second optical axis scan processing, the light obstruction counter Coff is set to 1, and the light obstruction detection continues. In this case, the light obstruction counter Coff is incremented. Even if the light obstruction detection is changed to the light entrance detection, the light obstruction counter Coff is not reset while the light entrance counter Con is lower than 7, but the light obstruction counter is maintained at the final value updated by the light obstruction detection.

In the example (4) of FIG. 7, because the result of the initial scan processing becomes the light obstruction detection, the light entrance counter Con is set to the initial value of 0, and the light obstruction counter Coff is set to m. The light entrance counter Con is incremented because the light obstruction is changed to the light entrance through the second optical axis scan processing. However, the light obstruction counter Coff is maintained at m because the control signal is in the off-state. When the light entrance counter Con reaches 7 to set the control signal to the on-state, the light obstruction counter Coff is reset according to the next light entrance detection.

In the examples (1) to (4) of FIG. 7, the same effects as the examples (1) to (4) of FIG. 5 are obtained with respect to the switching between the on-state and the off-state of the control signal. On the other hand, as to the malfunction notification, although the same results as the examples (1), (2), and (4) of FIG. 5 are obtained in the examples (1), (2), and (4) of FIG. 7, the result of the example (3) of FIG. 7 differs from the result of the example (3) of FIG. 5. Specifically, referring to the example (3) of FIG. 7, because the control signal is in the off state at the time the light obstruction detection is switched to the light entrance detection through the fourth optical axis scan processing, the light obstruction counter Coff is not reset, but the light obstruction counter Coff is maintained at 2. Then, because the results of the sixth and seventh pieces of optical axis scan processing become the light obstruction detection in the figure, the light obstruction counter Coff is incremented twice to become 4. Then, while the light entrance detection continues, the light obstruction counter Coff is maintained at 4 until the light entrance counter Con reaches 7.

As a result, even if the light entrance counter Con reaches 7 to return the control signal to the on-state, the malfunction notification is not performed because the value of the light obstruction counter Coff does not satisfy the condition of the malfunction notification (ST12 of FIG. 3). The light obstruction counter Coff is reset when the result of the fifteenth optical axis scan processing becomes the light entrance detection after the control signal returns to the on-state and determined as "YES" in ST36.

As illustrated in the example (3) of FIG. 7, according to the counter enumeration processing of FIG. 6, in the case where the light obstruction detection is intermittently generated while the control signal is maintained in the off-state by the light obstruction in the detection area S, even if the light obstruction is detected in a short period, the malfunction notification is not performed unless the light entrance detection is continuously generated at least seven times in the interval between the light obstruction detection. Therefore, the malfunction is determined by the reference stricter than that of the case where the counter enumeration processing of FIG. 4 is applied, so that reliability of malfunction notification can be enhanced.

In the embodiments of FIGS. 5 and 7, the control output is automatically returned according to the seven consecutive light entrance detection after control output is stopped. However, depending on the situation in the worksite, the control output is not automatically returned, but an attendant may manually return the control output after confirming safe conditions. However, in this case, the control output may automatically be returned only when the malfunction notification is performed.

In the embodiments illustrated in FIGS. 5 and 7, the light entrance state in which the object does not exist in the detection area S is set to the normal state, and a notification is made of the malfunction generated in the output switching when the light entrance detection is changed to the light obstruction detection. On the other hand, the light obstruction state in which the object is included in the detection area S is set to the normal state, and the change from the light obstruction state to the light entrance state may be detected as the state in which the object exits from the detection area S. In such cases as well, the pieces of processing relating to the light entrance counter and the light obstruction counter are set opposite to those of the above embodiments. When an output is switched by an erroneous light entrance detection through the similar processing, the output switching can be notified as the malfunction.

DESCRIPTION OF SYMBOLS

1 Projector
2 Optical receiver
10 Light emitting element
20 Light receiving element
13, 23 Optical axis sequentially-selecting circuit
14, 24 Control circuit
17, 27 Display circuit

The invention claimed is:

1. A multiple optical axis photoelectric sensor comprising:
a projector,
an optical receiver,
a plurality of optical axes between the projector and the optical receiver,
at least one selecting circuit configured to sequentially validate the optical axes,
a processor coupled to the at least one selecting circuit for conducting optical axis scan processing of the optical axes,
an output for outputting a light state of the photoelectric sensor, and
a variable update unit configured to update a first variable and a second variable according to every determination result of the optical axis scan processing,
wherein the light state comprises a light entrance state and a light obstruction state,
wherein the light state comprises the determination result of a detection area being in the light entrance state or the light obstruction state based on a result of the optical axis scan processing,
wherein the first variable is updated while the determination result that the detection area is in the light entrance state is continuously made, and the second variable is updated according to the determination result that the detection area is in the light obstruction state.

2. The photoelectric sensor of claim 1, wherein validation of the optical axes comprises a detection of an existence or non-existence of light entrance of at least one of the optical axes.

3. The photoelectric sensor of claim 1, wherein the processor is configured to determine a light state of the detection area formed by the plurality of optical axes.

4. The photoelectric sensor of claim 1, wherein the output comprises an on-state for the sensor being in the light entrance state and an off-state for the sensor being in the light obstruction state, with the on-state and off-state being selected for output according to the determination result.

5. The photoelectric sensor according to claim 1, further comprising a malfunction notification unit configured to provide notice at the output when the detection area is in the light obstruction state due to a malfunction.

6. The photoelectric sensor of claim 5, further comprising a notification control unit configured to activate the malfunction notification unit when a value of the first variable reaches a predetermined first reference value and when a final value of the second variable is equal to or lower than a predetermined second reference value.

7. The photoelectric sensor according to claim 6, further comprising a malfunction detection result output unit configured to externally output display control information for displaying the detection of a malfunction on a display when the notification control unit activates the malfunction notification unit.

8. The photoelectric sensor according to claim 1, wherein the first variable comprises a first reference value and the second variable comprises a second reference value, and the second reference value is set to a value smaller than that of the first reference value.

9. The photoelectric sensor according to claim 1, wherein the variable update unit is configured to measure a number of times the optical axis scan processing results in a determination that the detection area is in the light entrance state, and a number of times the optical axis scan processing results in a determination that the detection area is in the light obstruction state.

10. The photoelectric sensor according to claim 1, wherein the processor is configured to convert measurement values into a duration of time in updating the first variable and the second variable.

11. The photoelectric sensor of claim 1, wherein the first variable indicates a duration of the optical axis scan processing for which the determination result that the detection area is in the light entrance state is obtained, and the second variable indicates a duration of the optical axis scan processing for which the determination result that the detection area is in the light obstruction state is obtained.

12. The photoelectric sensor according to claim 1, further comprising storage configured to store information on the optical axis scan processing in which the output of a control signal is stopped according to the activation of the malfunction notification unit.

13. The photoelectric sensor according to claim 1, wherein the variable update unit is configured to process measurement of a duration of the optical axis scan processing for which the determination result that the detection area is in the light entrance state is obtained, and a duration of the optical axis scan processing for which the determination result that the detection area is in the light obstruction state is obtained.

14. A method for determining a light state of a detection area of a multiple optical axis photoelectric sensor, said detection area comprising a plurality of optical axes between a projector and an optical receiver of the photoelectric sensor, comprising the steps of:
   validating sequentially the optical axes,
   conducting a scan processing of the optical axes,
   detecting an existence or non-existence of light entrance of the validated optical axes,
   determining a light state of the detection area formed by the optical axes based on a result of the optical axis scan processing,
   measuring a number of times from the optical axis scan processing in which a result is obtained that the detection area is in a light entrance state, and a number of times from the optical axis scan processing in which a result is obtained that the detection area is in a light obstruction state,
   switching an output to an on-state or an off-state according to the result of the measuring step,
   determining if a light state is caused by a malfunction by updating a first variable and a second variable according to every determination result of the optical axis scan processing, and
   notifying a user when the light state is due to the malfunction,
   wherein the first variable is updated while the determination result that the detection area is in the light entrance state is continuously made, and the second variable is updated according to the determination result that the detection area is in the light obstruction state.

15. A method for determining a light state of a detection area of a multiple optical axis photoelectric sensor, said detection area comprising a plurality of optical axes between a projector and an optical receiver of the photoelectric sensor, comprising the steps of:
   validating sequentially the optical axes,
   conducting a scan processing of the optical axes,
   detecting an existence or non-existence of light entrance of the validated optical axes,
   determining a light state of the detection area formed by the optical axes based on a result of the optical axis scan processing,
   measuring a number of times from the optical axis scan processing in which a result is obtained that the detection area is in a light entrance state, and a number of times from the optical axis scan processing in which a result is obtained that the detection area is in a light obstruction state,
   switching an output to an on-state or an off-state according to the result of the measuring step,
   determining if a light state is caused by a malfunction by updating a first variable and a second variable according to every determination result of the optical axis scan processing, and
   notifying a user when the light state is due to the malfunction,
   wherein the first variable is updated while the determination result that the detection area is in the light obstruction state is continuously made, and the second variable is updated according to the determination result that the detection area is in the light entrance state.

16. A multiple optical axis photoelectric sensor comprising:
   a projector,
   an optical receiver,
   a plurality of optical axes between the projector and the optical receiver,
   at least one selecting circuit configured to sequentially validate the optical axes,
   a processor coupled to the at least one selecting circuit for conducting optical axis scan processing of the optical axes,
   an output for outputting a light state of the photoelectric sensor, and
   a variable update unit configured to update a first variable and a second variable according to every determination result of the optical axis scan processing,
   wherein the light state comprises a light entrance state and a light obstruction state,
   wherein the light state comprises a determination result of a detection area being in the light entrance state or the light obstruction state based on a result of the optical axis scan processing,
   wherein the first variable is updated while the determination result that the detection area is in the light obstruction state is continuously made, and the second variable is updated according to the determination result that the detection area is in the light entrance state.

17. The photoelectric sensor of claim 16, wherein validation of the optical axes comprises a detection of an existence or non-existence of light entrance of at least one of the optical axes.

18. The photoelectric sensor of claim 16, wherein the processor is configured to determine the light state of the detection area formed by the plurality of optical axes.

19. The photoelectric sensor of claim 16, wherein the output comprises an on-state for the sensor being in the light entrance state and an off-state for the sensor being in the light obstruction state, with the on-state and off-state being selected for output according to the determination result.

20. The photoelectric sensor according to claim 16, further comprising a malfunction notification unit configured to provide notice at the output when the detection area is in the light entrance state due to a malfunction.

21. The photoelectric sensor of claim 20, further comprising a notification control unit configured to activate the malfunction notification unit when a value of the first variable reaches a predetermined first reference value and when a final value of the second variable is equal to or lower than a predetermined second reference value.

22. The photoelectric sensor according to claim 21, further comprising a malfunction detection result output unit configured to externally output display control information for displaying the detection of a malfunction on a display when the notification control unit activates the malfunction notification unit.

23. The photoelectric sensor according to claim 16, wherein the first variable comprises a first reference value and the second variable comprises a second reference value, and the second reference value is set to a value smaller than that of the first reference value.

24. The photoelectric sensor according to claim 16, wherein the variable update unit is configured to measure a number of times the optical axis scan processing results in determination that the detection area is in the light entrance state, and a number of times the optical axis scan processing results in the determination that the detection area is in the light obstruction state.

25. The photoelectric sensor according to claim 16, wherein the processor is configured to convert measurement values into a duration of time in updating the first variable and the second variable.

26. The photoelectric sensor of claim 16, wherein the first variable indicates a duration of the optical axis scan processing for which the determination result that the detection area is in the light obstruction state is obtained, and the second variable indicates a duration of the optical axis scan processing for which the determination result that the detection area is in the light entrance state is obtained.

27. The photoelectric sensor according to claim 16, further comprising storage configured to store information on the optical axis scan processing in which the output of a control signal is stopped according to the activation of the malfunction notification unit.

28. The photoelectric sensor according to claim 16, wherein the variable update unit is configured to process measurement of a duration of the optical axis scan processing for which the determination result that the detection area is in the light entrance state is obtained, and a duration of the optical axis scan processing for which the determination result that the detection area is in the light obstruction state is obtained.

* * * * *